United States Patent [19]

Takahashi

[11] Patent Number: 4,510,464

[45] Date of Patent: Apr. 9, 1985

[54] LC-SWITCHED TRANSISTOR OSCILLATOR FOR VIBRATOR EXCITATION

[75] Inventor: Minoru Takahashi, Funabashi, Japan

[73] Assignee: TDK Corporation, Tokyo, Japan

[21] Appl. No.: 427,772

[22] Filed: Sep. 29, 1982

[30] Foreign Application Priority Data

May 29, 1982 [JP] Japan .................................. 57-90509

[51] Int. Cl.³ .............................................. H03B 5/36
[52] U.S. Cl. ................................. 331/116 R; 331/161; 310/316
[58] Field of Search ............. 331/116 R, 116 FE, 158, 331/161; 310/316, 317; 340/870.34

[56] References Cited

U.S. PATENT DOCUMENTS 3,581,240  5/1971  Enderby ........................ 331/161 X
4,318,062  3/1982  Mitsui et al. ................. 331/116 R X
4,338,576  7/1982  Takahashi .................... 331/116 R X
4,359,697  11/1982 Takahashi ....................... 331/116 R
4,431,975  2/1984  Podlesny ..................... 331/116 R X

OTHER PUBLICATIONS

Craig, W. E., "Oscillator", *IBM Technical Disclosure Bulletin*, vol. 5, No. 2, Jul. 1962.
Stankaitis, R. F., "Crystal Controlled Blocking Oscillator", *IBM Technical Disclosure Bulletin*, vol. 4, No. 3, Aug. 1961.

*Primary Examiner*—Eugene R. LaRoche
*Assistant Examiner*—D. C. Mis
*Attorney, Agent, or Firm*—Robert Scobey

[57]  ABSTRACT

A self-oscillating vibrator exciting circuit utilizing a drive transistor that operates in a switching mode. The ON-period of the transistor is determined by base/emitter inductance and capacitance and base/collector capacitance, while the OFF-period of the transistor is determined by collector/emitter inductance and capacitance. The vibrator is connected between transistor collector and emitter, and the ON-period frequency of the transistor is set in the neighborhood of the resonance frequency of the vibrator so that the vibrator exciting circuit oscillates generally at the resonance frequency of the vibrator.

5 Claims, 6 Drawing Figures

LC-SWITCHED TRANSISTOR OSCILLATOR FOR VIBRATOR EXCITATION

BACKGROUND AND BRIEF DESCRIPTION OF THE INVENTION

This application claims the benefit of the priority under the International Convention and hereby specifically incorporates by reference the disclosure of Japanese Utility Model application No. 57-90509 filed 29 May 1982.

The present invention relates to a vibrator exciting circuit suited to drive a vibrator with horn and, particularly, to a vibrator exciting circuit which is adapted to drive a piezoelectric vibrator efficiently at the resonance frequency of the vibrator.

A conventional vibrator of the Langevin type or the like, wherein the amplitude of oscillation is amplified by a horn connected with the vibrator, is driven at a point where the resonance frequency has a low impedance. This is because the amplitude becomes maximum at the resonant point. Therefore, most prior art oscillation systems have been arranged as shown in FIG. 1, such that a vibrator TD is provided with a pickup electrode 1, and the voltage on the electrode is fed back to an amplifier 2, so that oscillation follows the maximum amplitude. This method, however, needs a third electrode on the vibrator, and further requires a phase compensation circuit and the like, causing the circuit disadvantageously to become complex and thus expensive.

On the other hand, in applications where the accuracy of frequency and efficiency are not the primary concerns, such as a self-oscillator used in a cleaner, an arrangement has been made as shown in FIG. 2, such that a feedback transformer 3 or an LC tuning circuit provided in the feedback loop is combined with an amplifier 4 and a vibrator TD. However, this circuit arrangement disadvantageously requires the fine adjustment of the tuning circuit when each vibrator has a different resonance frequency.

Vibrator exciting circuits without a resonant point for use in supersonic sprays are disclosed in Japanese Utility Model Publication No. 56-33659 and Japanese Patent Publication No. 56-40640. However, these arrangements are modified Colpitts circuits by utilization of the inductive portion of the vibrator, and do not oscillate at the resonance frequency; thus they are not the best arrangements for sprays that operate efficiently at the maximum amplitude of oscillation.

In view of the foregoing prior art deficiencies, the present invention contemplates providing a vibrator exciting circuit which has a simple circuit arrangement, drives the vibrator at its resonant point, and provides a satisfactory power transmission characteristic. Briefly, the circuit utilizes a drive transistor operating in a switching mode, in which the ON-period of the transistor is determined by base/emitter inductance and capacitance and base/collector capacitance, while the OFF-period of the transistor is determined by collector/emitter inductance and capacitance, and in which the vibrator is connected between the collector and emitter of the transistor, with the frequency of the ON-period of the transistor being set in the neighborhood of the resonance frequency of the vibrator so that the exciting circuit oscillates at the resonance frequency of the vibrator.

The following describes presently preferred embodiments of the present invention, with reference to the drawings.

DETAILED DESCRIPTION

Figure 1:
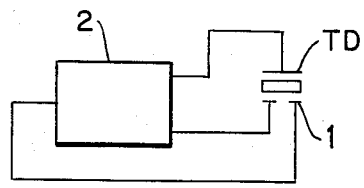
FIG. 1 is a block diagram showing a conventional oscillation system.
Figure 2:
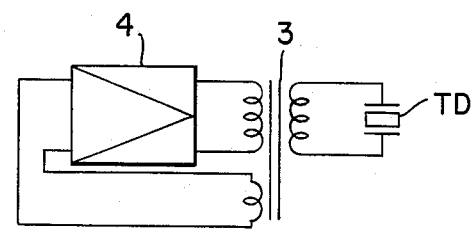
FIG. 2 is a block diagram showing a conventional vibrator exciting circuit.
Figure 3:
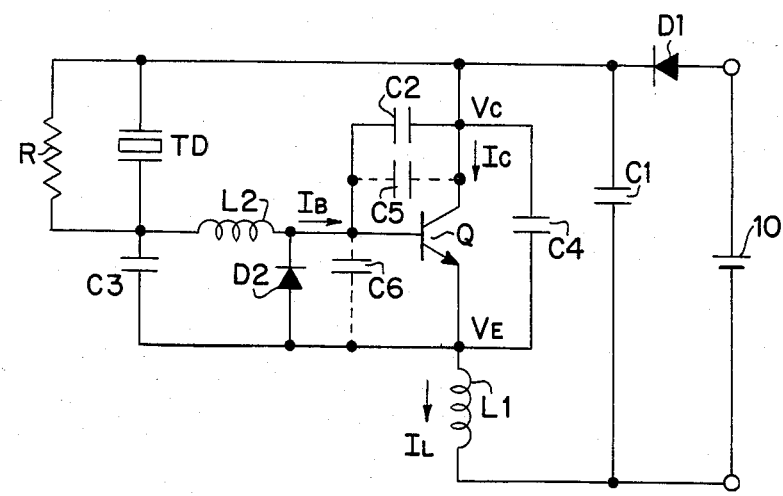
FIG. 3 is a schematic circuit diagram showing a vibrator exciting circuit embodying the present invention.

In FIG. 3, a DC power source 10 has a positive terminal connected to the collector of a transistor Q and one terminal of a capacitor C1 through a diode D1 which protects the circuit when the power source is connected in the opposite polarity. A negative terminal of source 10 is connected to the emitter of the transistor Q through a coil L1 and also to another terminal of the capacitor C1. Connected between the collector and the base of the transistor Q are a capacitor C2 and a series connection of a vibrator TD and a coil L2. The vibrator TD is connected in parallel with a bias resistor R, and a capacitor C3 is connected between the emitter of the transistor Q and the junction of the vibrator TD and the coil L2. A diode D2 is connected between the base and the emitter of the transistor Q, and a capacitor C4 is connected between the collector and the emitter. Capacitors C5 and C6, shown with dashed connections, represent the capacitances existing in the transistor Q, i.e., inter-electrode capacitances.

Representative values of the circuit components for providing an oscillation frequency of 100 kHz under a 12 volt supply voltage of the DC power source 10 are as follows:

L1: 156 µH
L2: 82 µH
C2: 100 pF
C3: 0.2 µF
C4: 6800 pF

Figure 4:
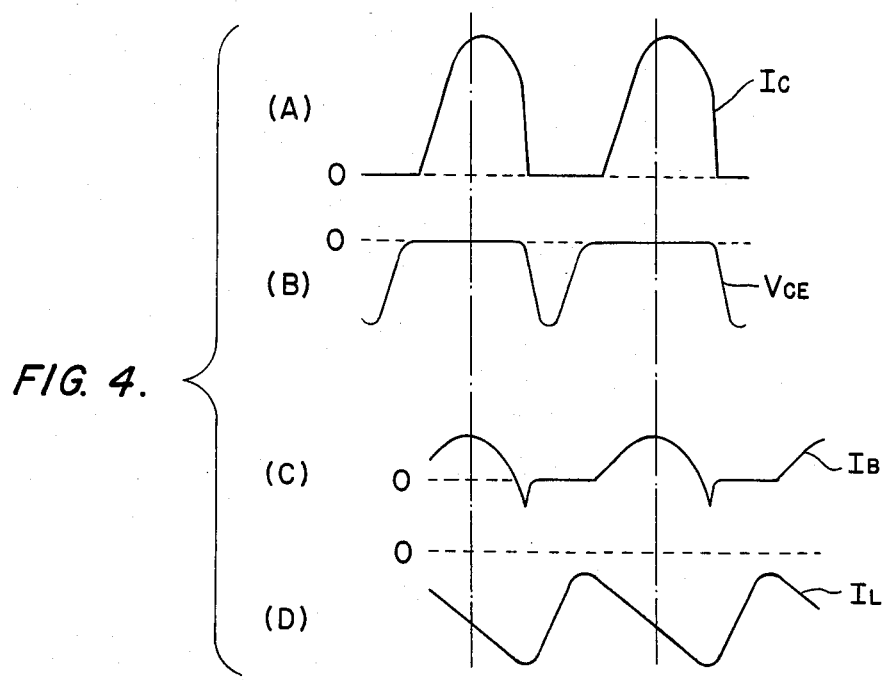
FIG. 4, A,B,C and D is a waveform diagram showing the operation of the circuit of FIG. 3.

FIG. 4A depicts the collector current $I_C$ of the transistor Q in the vibrator exciting circuit shown in FIG. 3. FIG. 4B depicts the collector to emitter voltage $V_{CE}$ of the transistor Q. FIG. 4C depicts the base current $I_B$ of the transistor Q. FIG. 4D depicts the current $I_L$ in the coil L1.

Figure 5:
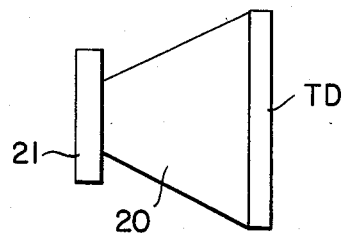
FIG. 5 is a side view showing an example of a vibrator as in a circuit such as in FIG. 3 with horn.

FIG. 5 shows an example of a vibrator having a horn excited by the vibrator exciting circuit of FIG. 3, wherein vibrator TD is fixed on the major end face of a horn 20, and a resonance plate 21 is provided integrally on the opposite end of the horn 20.

The following is the operation of the circuit of FIG. 3. First, the principle of oscillation will be described on the assumption that the vibrator TD is absent from the circuit. When power is supplied to the circuit, the base current $I_B$ is supplied through the bias resistor R to the transistor Q, and consequently the collector current $I_C$ starts flowing as shown in FIG. 4A. At the same time, the collector to emitter voltage $V_{CE}$ of the transistor Q falls, and the emitter voltage $V_E$ relative to the voltage at the negative terminal of the DC power source 10 rises. The base current $I_B$ shown in FIG. 4C increases and decreases in a period (frequency) determined by the resonant circuit constituted by the coil L2 and capacitances C2, C3, C5 and C6, and maintains the transistor Q in an ON state during the positive cycle. The base current cuts off the transistor Q sharply when it enters the negative cycle. Once the transistor has been cut off, the collector voltage $V_C$ rises sharply, causing a current to flow in the loop including the coil L1 and the capacitors C1 and C4; then the emitter voltage $V_E$ starts to rise. When the emitter voltage $V_E$ turns to fall, the base current $I_B$ starts to flow again. At this time, the current through the diode D2 makes a sharp increase in the base current $I_B$. Thus the transistor Q turns on and off repetitively, with its ON-period determined by the coil L2 connected between the base and the emitter and a capacitor C2 and/or capacitance C5 connected and/or existing between the base and the collector, and with its OFF-period determined by the coil L1 and the capacitors C1 and C4 connected between the collector and the emitter. Consequently, the current $I_L$ of the coil L1 has a waveform with two periods as shown in FIG. 4D.

When the vibrator $T_D$, with its resonant Q being higher than that of the circuit, is connected in the circuit, the period of the base current $I_B$ is determined by the resonance frequency of the vibrator TD. For example, a circuit as in FIG. 3 has an oscillation frequency of 93 kHz for the circuit without involving the vibrator, and it operates in an oscillation frequency pulled in the resonance frequency of the vibrator TD of 100 kHz. In the pull-in oscillation state, the circuit current is determined by the minimum impedance of the vibrator.

The effects achieved by the foregoing embodiment are as follows.

(1) The circuit arrangement is simple and thus inexpensive. The circuit provides a satisfactory power transmission characteristic and high efficiency, since it operates at the resonance frequency of the vibrator TD.

(2) Oscillation proceeds even if the connection for the vibrator TD is open-circuited, preventing the abnormal current caused by that event which would otherwise destroy the transistor Q and other components.

(3) The transistor Q operates in a complete switching mode during oscillation, generating less heat by transient power loss.

(4) The circuit can drive the vibrator TD with a current waveform approximating a sine wave.

It will be appreciated that the capacitor C2 connected between the collector and the emitter of the transistor Q may be eliminated, and substituted by the internal capacitance C5 existing between the collector and the base when the transistor has a sufficiently high current gain.

Figure 6:
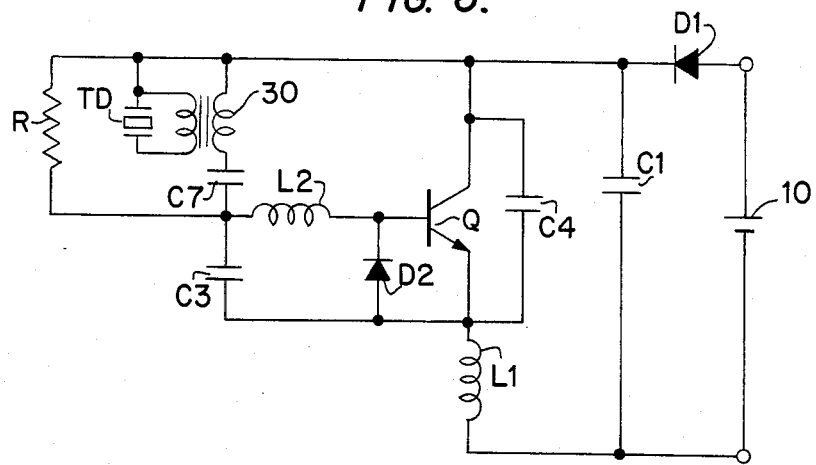
FIG. 6 is a schematic circuit diagram of another vibrator exciting circuit embodying the present invention.

FIG. 6 shows another embodiment of the present invention. In this arrangement, a vibrator TD is connected through an impedance matching transformer 30 to the collector and the base of the transistor Q, with a DC blocking capacitor C7 provided in series with the primary winding of the transformer. The remaining portions of the circuit are the same as shown in the circuit of FIG. 3, except that the capacitor C2 of FIG. 3 has been omitted, and the inter-electrode capacitances C5 and C6 have not been shown.

The arrangement of FIG. 6 is advantageous in maintaining a satisfactory impedance matching between the vibrator TD and the circuit when the supply voltage is varied.

According to the present invention, as described above, a vibrator exciting circuit having a simple circuit arrangement and capable of driving a vibrator at its resonant point for satisfactory power transmission is achieved.

It will be appreciated that the presently preferred embodiments of the invention may be modified. The invention, therefore, is to be defined by the following claims.

I claim:

1. A vibrator exciting circuit comprising a self-oscillation circuit wherein a drive transistor operates in a switching mode, the ON-period of said transistor being determined by inductance and capacitance between the base and the emitter of said transistor and capacitance between the base and the collector of said transistor, the OFF-period of said transistor being determined by inductance and capacitance between the collector and the emitter of said transistor, the vibrator being connected between the collector and the emitter of said transistor, the frequency of the ON-period of said transistor being set in the neighborhood of the resonance frequency of said vibrator so that said vibrator exciting circuit oscillates with its oscillation frequency pulled in said resonance frequency of said vibrator.

2. A vibrator exciting circuit as in claim 1, wherein interelectrode capacitance between electrodes of said transistor generally determines one or more of said capacitances.

3. A vibrator exciting circuit as in claim 1, wherein one or more capacitors generally determine said capacitances.

4. A vibrator exciting circuit as in any of claims 1-3, wherein one or more inductors generally determine said inductances.

5. A vibrator exciting circuit as in claim 1, wherein said vibrator is coupled to said transistor by an impedance matching transformer.

* * * * *